(12) United States Patent
McGrail

(10) Patent No.: US 8,837,118 B2
(45) Date of Patent: Sep. 16, 2014

(54) TRANSFORMER INSTRUMENTATION AND METERING SYSTEM

(76) Inventor: Kenneth William McGrail, Halifax (CA)

( * ) Notice: Subject to any disclaimer, the term of this patent is extended or adjusted under 35 U.S.C. 154(b) by 219 days.

(21) Appl. No.: 13/556,309

(22) Filed: Jul. 24, 2012

(65) Prior Publication Data
US 2013/0027818 A1 Jan. 31, 2013

Related U.S. Application Data

(60) Provisional application No. 61/457,975, filed on Jul. 25, 2011.

(51) Int. Cl.
*H02H 7/04* (2006.01)
*H01F 41/00* (2006.01)
*H01F 38/28* (2006.01)

(52) U.S. Cl.
CPC ..................................... *H01F 38/28* (2013.01)
USPC ............. 361/663; 361/38; 361/624; 361/664; 324/74; 324/127; 324/137; 324/142

(58) Field of Classification Search
USPC ........... 361/601, 38, 663, 660, 664, 668, 670, 361/659, 661, 662, 724, 727; 324/74, 114, 324/141, 142, 127, 137, 107, 500, 509, 324/754; 439/146, 508, 517, 569, 574–576, 439/571–573; 200/5 A, 15, 50.33, 50.35; 312/223.2
See application file for complete search history.

(56) References Cited

U.S. PATENT DOCUMENTS

| 2,688,117 | A | * | 8/1954 | Knopp | 324/74 |
| 3,183,408 | A | * | 5/1965 | Keller et al. | 361/663 |
| 5,001,420 | A | * | 3/1991 | Germer et al. | 324/142 |
| 6,369,548 | B1 | * | 4/2002 | Oberzaucher et al. | 320/166 |
| 6,384,350 | B1 | * | 5/2002 | Shincovich et al. | 200/5 A |
| 7,479,029 | B2 | * | 1/2009 | Cook et al. | 439/517 |
| 7,492,557 | B2 | * | 2/2009 | Noguchi et al. | 361/42 |
| 7,563,999 | B2 | * | 7/2009 | Ball et al. | 200/293 |
| 7,857,660 | B2 | * | 12/2010 | Austin | 439/517 |
| 8,421,639 | B2 | * | 4/2013 | Bitsch et al. | 340/664 |

* cited by examiner

*Primary Examiner* — Michail V Datskovskiy
(74) *Attorney, Agent, or Firm* — James Marc Leas

(57) ABSTRACT

A combined current transformer and metering system is described, having a securable case, two or more current transformers each having a core and secondary windings connected to a secondary circuit, wherein the transformers are mounted within the case. A wiring harness connects the secondary windings of the transformers with shorting current switches for short circuiting the secondary current circuit, and voltage switches for disconnecting a voltage, wherein both sets of switches are mounted on the case. A process of manufacturing the system is described, wherein the transformer cores are positioned within the case, the wiring is connected between the transformer cores and attachment hardware on an upper deck of the case, and insulation medium is inserted within the case. A base plate is described, having rails to hold the system and having a tab at one end, and apertures for a rod positionable between rails at a second end.

10 Claims, 10 Drawing Sheets

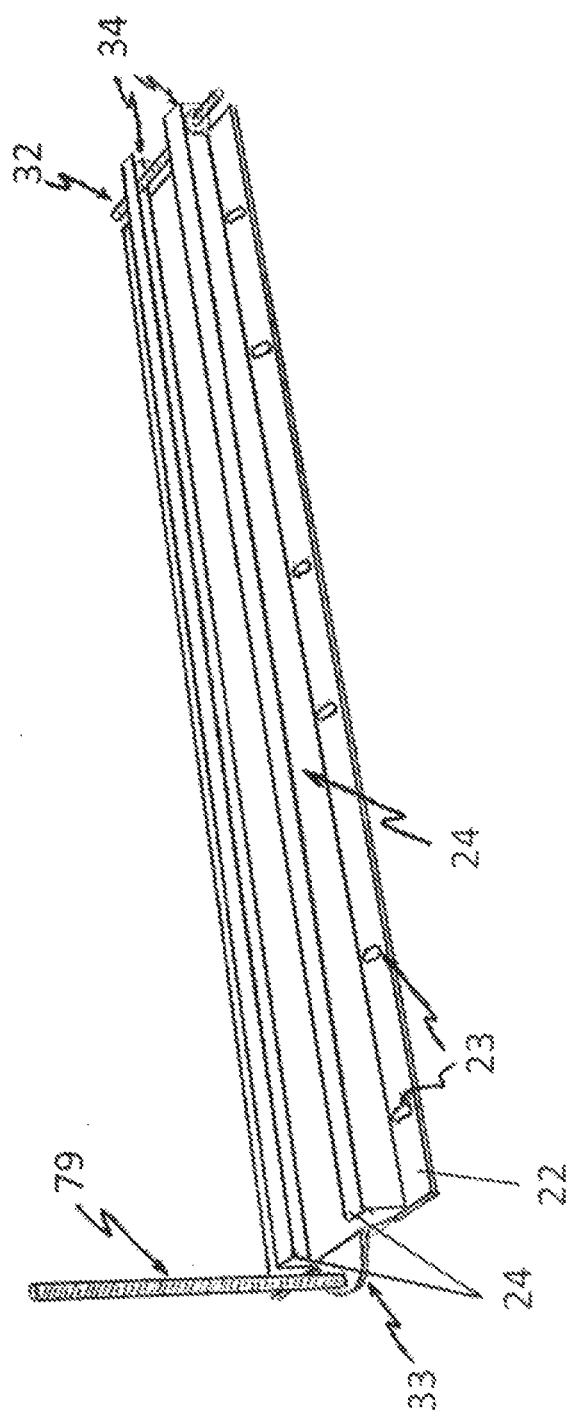

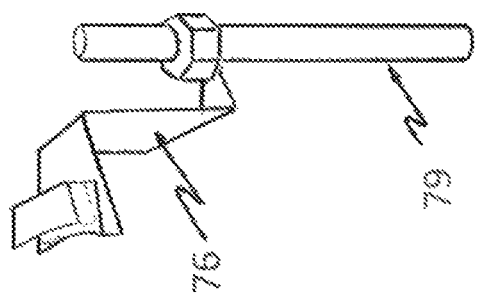
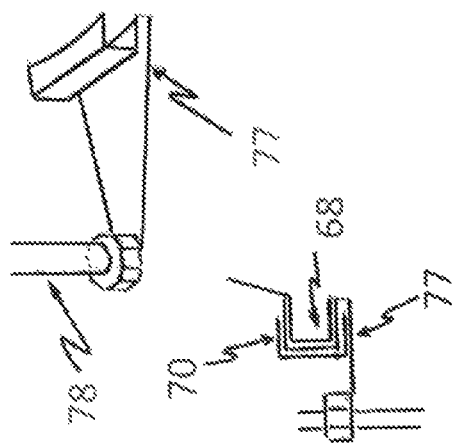
Fig. 8

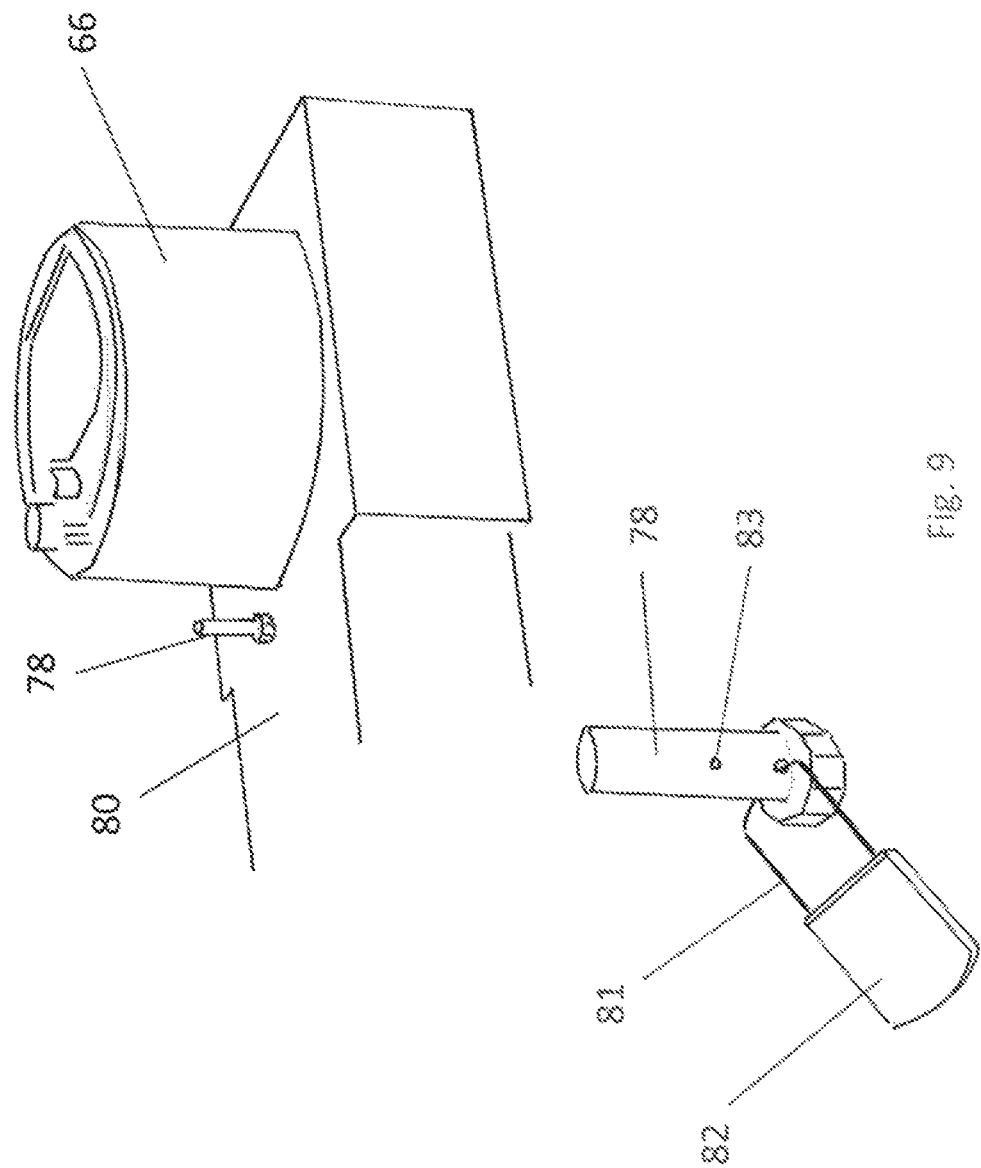

TRANSFORMER INSTRUMENTATION AND METERING SYSTEM

This application claims priority of U.S. Provisional Patent Application 61/457,975, filed Jul. 25, 2011, "Transformer Instrumentation and Metering System."

FIELD

The invention relates to a combined transformer and metering system. More particularly the invention relates to the control of both primary and secondary voltage and secondary current outputs from Low Voltage transformers whereby the mounting of the instrumentation (meter) is integral (but not necessary) to the same unit.

BACKGROUND

An Instrument Current Transformer is a transformer designed to provide a current in its secondary coil proportional to the current flowing in its primary coil. Instrument transformers are used for measuring voltage and current in electrical power systems, and for power system protection and control. Where a voltage or current is too large to be conveniently used by an instrument, it can be scaled down to a standardized, low value. Instrument transformers isolate measurement, protection and control circuitry from the high currents or voltages present on the circuits being measured or controlled.

In the case of the electric utility and the electric utility industry, the meter is the cash register for all revenue. For the past 110 years meter manufacturers, utilities and their customers have continued to standardize the art of revenue metering. The Electric Utilities Industry has continued to update both their metering practices and metering standards, because of the innovation of new products and meters. The industry's standards and practices go back 100 years; the primary change in metering is the functionality and accuracy of the meter as well as the ability to meter different forms. The meter's physical size and shape has not really changed in 100 years because the infrastructure (meter socket) has not changed. The transformer is still an integral part of a transformer rated metering system, and there are no plans to replace the transformer and build a meter that can withstand high current and voltage conditions The basic electromechanical design of the transformer (core, primary and secondary winding) has not changed over time. The physical structure of the transformer has been standardized for mounting purposes and the ability to endure extreme conditions that could cause internal damage have slightly improved over the years based on new insulating material. Today only the second generation of instrument transformers are available and there haven't been new developments in this area for 25 years.

Instrument Transformers are constructed to comply with the following standards:
Canadian Standards Association (CSA)
American National Standards Institute (ANSI)
The Electrical and Electronic Manufacturers Association of Canada (EEMAC)
AEIC—EEI—NEMA Standards for Instrument Transformers
UL and Measurement Canada Instrument Transformers are constructed to comply to the following tests:
Continuous Thermal Rating: 200% of rated current
One second thermal rating: 50 times normal current
Impulse Test: 10 kv full wave
60 Hz insulation test: Primary-4000V for one minutes The test switch is utilized in series between the transformers and the meter. The test switch is comprised of current shorting switches and voltage switches. The primary function of the test switch is to short the secondary winding of the current transformer. Often a meter is changed, and when we remove the meter (without using the current shorting switch), we open the secondary circuit. When the secondary circuit is left open, voltage builds up in the current transformer. The high voltage build up can cause damage to the current transformer and could effect accuracy or ultimately catch fire. The secondary function of the test switch is to provide a means to test the meter and or system A socket meter plugs into a socket, an adapter or a microswitch. These North American standard devices are designed to accept a socket meter. Small copper lugs extrude out from the bottom of the base of the meter, and these lugs penetrate the jaws of the socket. The variation of the number of lugs and their location on the base of the meter reflects the type of service being metered. Once the socket meter is installed and the lugs have penetrated the jaws of the socket, the outer edge flange of the meter is now aligned with the collar of the meter cabinet. The collar is on the outside face of a meter cabinet that contains a socket adapter for the meter to plug into. When the meter is installed the cabinet collar abuts against the meter flange. A meter ring is lowered over the collar and the flange, grasping both the collar and the flange and preventing them from separating. The meter can now be protected and secured to the cabinet by the use of a meter ring. The socket meter is the preferred meter of choice for most installations because the infrastructure is already present and the ease of removal. There are however different meter connection scenarios that include bottom connect meters, switchboard meters and European design meters etc. The design of the TIMS will accommodate most meter installation connections.

To appropriately meter, protect and secure a polyphase meter installation whose load is greater than 200 amps, electric utilities require (3) separate current transformers (one for each phase), a test switch and a meter socket arrangement for socket meters. These devices are installed by utility personnel in several metal cabinets at the site of the electric load. The transformers are located in a transformer cabinet complete with mounting bracket (including Cooper CT Mounting bracket). The test switch and meter mounting and attachment devices are located in a metering cabinet. Today these devices are separate items that are required to be wired and interconnected to each other according to metering standards and utility practices and meter type.

The cost of ownership for a transformer rated metering system is relatively high in comparison to a self contained system. Before a trained utility metering personnel enters a transformer rated metering site he must be trained and educated on a regular basis. Inventory of over 30 items associated with a transformer rated metering system used in conjunction with installation must be stocked and stored. Therefore the financial costs to install, secure, and maintain an accurate metering system is high. The cost of metering errors and the cost of stolen power must also be considered.

Accuracy of the system is critical for appropriate billing for both the customer and the utility. Testing of the accuracy of the transformer is performed during manufacturing and testing of the meter is periodically done, but the transformer metering system is rarely tested as a system. There are a number of factors that could influence the accuracy of the system; one factor that must be taken into consideration is the burden of the system (load; distance between transformers and the meter and the meter itself have a burden). The design of the core is singularly responsible for accuracy and burden characteristics. Commissioning, performed by the testing of the primary and comparing results with both the secondary and meter is rarely done. The best way to test the accuracy is to test the system as a singular metering entity.

Management and security of the system is maintained by providing a means of detecting any intrusion or disruption of the system. Utilities use a number of seals for each transformer, test switch, cabinet, and meter for security purposes. The intention is not to prevent intrusion, but detect infringement.

Presently Electric utilities use both bar-type and window type instrument transformers for low voltage applications. Each transformer must not only comply with Standards and Tests but must also meet accuracy characteristics for revenue purposes. Each manufacturer's transformer must meet certain physical characteristics for mounting, markings and identification. Each transformer must endure testing without physical or accuracy deterioration.

Presently transformers are installed in a cabinet on a mounting bracket. At times utilities specify other requirements such as the Cooper CT Mounting bracket, yet still installed in a cabinet. Typically utilities do not purchase cabinets, only the metering equipment. Other installation scenarios would include a Bus-bar arrangement. The cabinets and power distribution are typically located in a electric room.

SUMMARY

A current transformer system is disclosed, comprising a securable case, two or more current transformers each having a core and secondary windings connected to a secondary current circuit, the transformers mounted within the case, a wiring harness within the case connecting the secondary windings of the two or more transformers having shorting current switches on the case, the shorting current switches connected to the wiring harness for short circuiting the secondary current circuit, and voltage switches on the case and connected to the wiring harness for disconnecting a voltage.

The system is further described wherein the current transformers are window type transformers having a transformer window. The system is described further comprising bar inserts for placement within each transformer window, each bar insert providing a primary winding for each transformer.

The system of is further described wherein the current transformers are bar-type transformers. One embodiment of the system further comprises an instrument mount for a meter connected to the secondary current circuit, wherein the current switches are connected to the instrument mount. The transformers may be dual ratio transformers.

In an embodiment the system further comprises a base plate for mounting the system to a stationary object, comprising a rectangular plate having first and second ends, having at least one rod aperture at a first end and a plurality of mounting holes for affixing to a stationary object, at least one rod for engaging with the at least one rod aperture for locking the system on the base plate, and two rails running in parallel on the rectangular plate for engaging with corresponding grooves in a case of the system.

One embodiment further comprises a securable cover for protecting the switches and meter, the cover securable by at least one seal. An embodiment further comprises a cover bolt to fasten the cover to the system, the cover bolt secured by a seal. The case of the system may be made of a material selected from the group consisting of metal, plastic and composite material.

A process of manufacturing the transformer system is described, comprising the steps of providing a case of the system, positioning at least two transformer cores having bars within the case, wherein each core's bars protrude from the case, connecting a wiring harness having attachment hardware to the transformer cores, positioning the attachment hardware through an upper deck of the case, and inserting an insulation medium within the case to isolate and insulate the electrical components.

A process of manufacturing the transformer system is described comprising the steps of providing a case of the system, the case having windows, positioning one transformer core adjacent each window, connecting a wiring harness having attachment hardware to the transformer cores, positioning the attachment hardware through an upper deck of the case, and inserting an insulation medium within the case to isolate and insulate the electrical components.

In one embodiment of the process the attachment hardware is pushed through the upper deck. The process may further comprise the step of attaching the base plate to the case for mounting the system. The process may further comprise the step of aligning the cores. In one embodiment of the process the step of inserting an insulation medium saturates and encompasses the individual components.

The base plate of the transformer system for mounting the system to a stationary object is also described, wherein the base plate comprises a rectangular plate having first and second ends, having at least one rod aperture at a first end and a plurality of mounting holes for affixing to a stationary object, at least one rod for engaging with the at least one rod aperture for locking the system on the base plate, and two rails running in parallel on the rectangular plate for engaging with corresponding grooves in a case of the system.

In one embodiment the base plate further comprises an upturned tab at a first end of the rectangular plate within which the rod aperture is positioned, the tab to stop forward movement of the system off the rails. Further described is the base plate wherein the rails extend beyond the second end of the plate and further comprise corresponding rod apertures for receiving a rod, to lock the system on the base plate. In one embodiment the base plate is described wherein the rectangular plate and rails are made of a material selected from the group consisting of metal, plastic and composite material.

DESCRIPTION OF FIGURES

FIG. 1B shows an isometric view of the base plate;

FIG. 8 shows a detail view of the reinforcing plates; and

FIG. 9 shows a detail view of the seal of the cover bolt.

DETAILED DESCRIPTION

Figure 1:
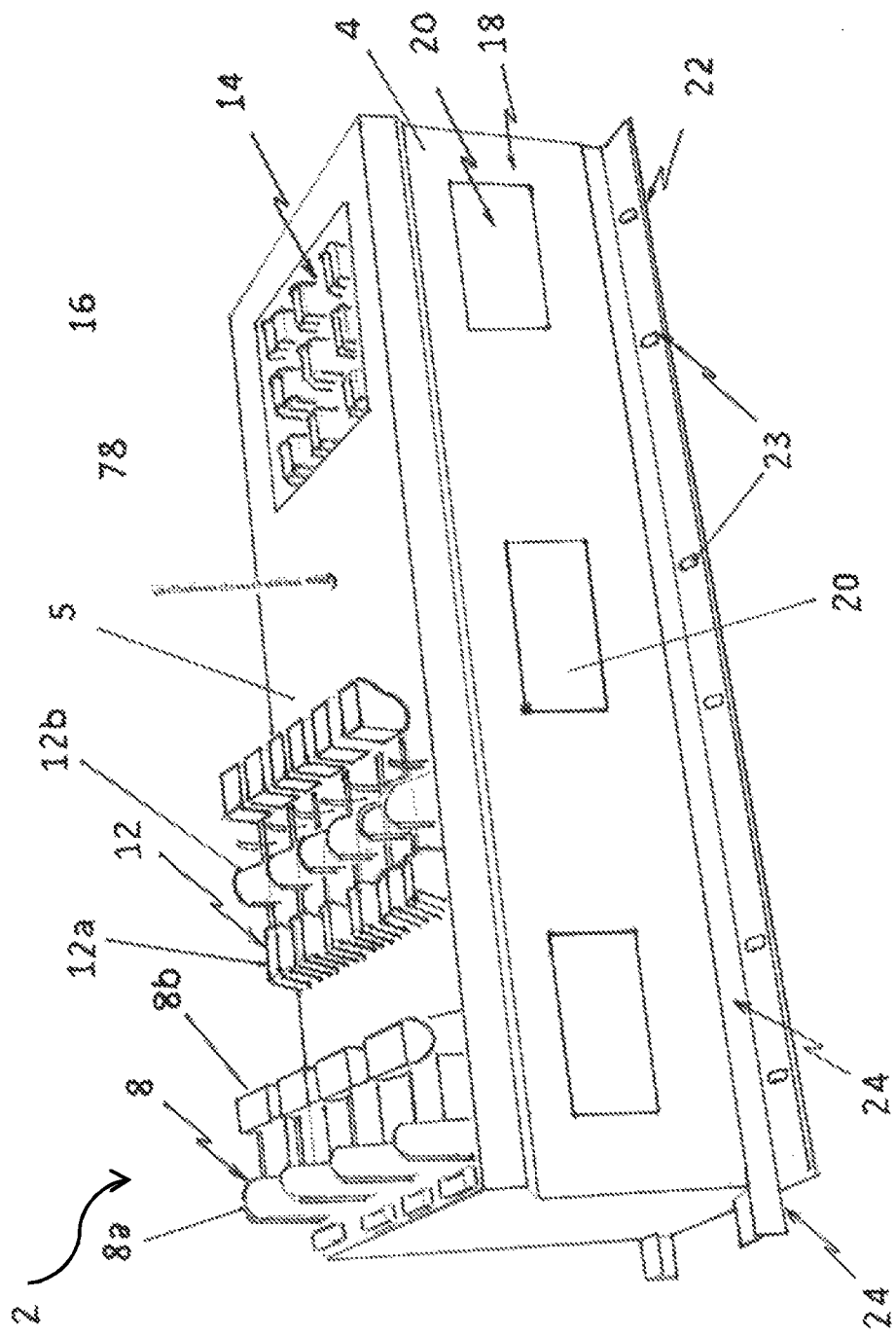
FIG. 1 shows an isometric view of the transformer metering system without the cover.

The present invention "Transformer Instrumentation and Metering System" (TIMS) refers generally to 2 or more window-type or bar type current instrument transformers whose secondary coils and leads are encapsulated in a single housing, with an integral instrument mount complete with shorting and a disconnecting means for the purpose of providing secondary current to any electrical instrument for monitoring measuring and control. The TIMS also provides terminals and switches for a direct concealed connection to primary voltage. Provision for secondary voltage connection is provided so that it can be used in conjunction with potential transformers or secondary voltage.

More particularly the invention relates to the control of both primary and secondary voltage and secondary current outputs from Low Voltage transformers whereby the mounting of the instrumentation (meter) is integral (but not necessary) to the same unit. The system is made up of two levels separated by a Wiring Harness; the lower level houses the encapsulated instrument current transformers (magnetic cores, secondary winding and primary winding or a provision for primary winding), the upper level provides a functional platform for a complete encapsulated, secure prewired system for instrumentation and metering. The TIMS can simply be a multi-station transformer.

The TIMS provides a transformer based prewired switching and testing system for metering, monitoring, and measuring electric services utilizing and connecting with instruments from all manufacturers. The TIMS is also a complete and secure, transformer rated electric metering system device for numerous low voltage electric service applications that range up to 750 volt and 2000 amp applications, but not limited to. The multi-station transformer will abide by North American and European standards for instrument transformers. As a metering device it will be available for all single phase meters and polyphase meter forms and wiring combinations in accordance with ANSI standards; that take into consideration socket-based, bottom connect, switchboard meters for both North American and European markets.

On the upper deck of the upper level of the TIMS are pluralities of switches that are shorting devices for secondary currents, switches and testing terminals for low voltage primary leads. Also on the upper deck is a provision for optional meter or instrument mounting. The instrument connection or mounting completes the instrument or metering system connecting the source to the meter.

The TIMS is a combination of all devices described above, prewired and secure, requiring only the connection of the primary conductor. Connecting the primary conductor can be as simple as passing the conductor through its window slots. The primary conductor can be either the LV insulated primary leads or connection of the primary leads to the bar or single primary winding. Next, the tapping of the primary leads for a voltage source and the mounting of an appropriate metering device in the provided meter socket complete the meter system.

There are two variations with respect to this setup, i) having an optional removable primary bar assembly or bar insert, and ii) having LV insulated secondary leads for voltage utilizing Potential transformers.

The time utility trained personnel are required at the site is reduced by the use of the TIMS, as the time to wire and secure the meter has been removed. The design of the TIMS enables the utility personnel to quickly install the system in a metal cabinet or bus-bar arrangement and or a Standard CT Mounting Bracket, but not limited to such. The utility would attach the transformers' base to the cabinet mounting plate and connect the primary conductors. In the case of a Bus Bar arrangement, the base is not required to be attached to the transformer, the Bus (primary conductor) would pass through the window. Perhaps because of the non technical requirements to install a TIMS as well as the fact that the unit is secure, the utility customer could install the meter system by themselves at their site. The TIMS arrives on site prewired and secured, the integrity of the system is not compromised because the TIMS is sealed. The TIMS can be installed without removing the seal. When connecting the primary conductor the technician has an option with regard to the transformer as using a window-type transformer (large enough to hold (3) 500 MCM cable for each window) or a Bar-type transformer with the insertion of the Bar insert into the window. With the installation of a TIMS, the cost of ownership is greatly reduced in addition to a reduction of metering errors, the reduction of stolen power and ultimately the reduction of utility man power to install and maintain the system.

With reference to FIG. 1, an isometric view of the transformer metering system 2 is shown. The case 4 of the transformer is generally rectangular. In one embodiment the case 4 is a rectangular shape made of a non-conductive material (plastic), however it may be formed in any convenient and useful shape, and may be made of any materials or combination of materials that provide the required robustness to render it useful. The view exhibits the upper deck 5 of the transformer where in this embodiment there are 4 voltage switches 8 and the 3 pairs of current shorting switches 12 installed on the left side of the upper deck, due to the fact that it is a 3-phase system. The voltage switches 8 have a line side 8a and a load side or metering side 8b. Similarly, the current shorting switches 12 have a line side 12a and a load side 12b. At one end of the deck 5 is an inset 14 wherein meter installation lugs 16 for North American standard meters are installed. In an embodiment for European systems, for instance, the lugs 16 would correspond to a European standard meter. The inset 14 lowers the overall height of the transformer with the meter (not shown) attached.

The side 18 of the case 4 of the transformer depicts (3) window-type current transformers with windows 20. The windows 20 are rectangular slots allowing for (3) 500 MCM conductor cables (not shown) to pass through each window 20, thus acting as the primary winding. A bar insert can act as a primary winding, a bar insert (shown in FIG. 4) can fit inside the window 20. Finally the current transformer could be a Bar-type transformer. In one embodiment the window centers are 7" apart allowing the transformer metering system 2 to be installed in a Standard CT mounting bracket (not shown). In the case of a Bus Bar arrangement, the manufacturers of Power Control Panels have some flexibility as to the spacing of the Bus Bar to meet the TIMS physical dimensions; otherwise the TIMS window spacing could change to meet all manufacturers' types of Power Control Panels With reference to FIGS. 1 and 1B, the base plate and the mounting system is shown. The base plate 22 having a number of side mounting holes 23 is attached to the transformer. Attached along the length of the base plate 22 (inside the attachment holes) there are 2 parallel rails 24 (90 degree angles) that extend from the front to the back of the plate. The rails 24 are separated by the width of the TIMS. The installation of the base plate 22 to the TIMS begins by sliding the rails 24 of the base plate 22 along the grooves (not shown) embedded in the TIMS. The grooves (not shown) in both the rear and the front of the transformer case 4 are implanted into the plastic injected mold and elastomer insulation. The base plate rail 24 design has 90 degree angled brackets that are mounted on top of the base plate. The brackets hold and secure the TIMS to the base plate, and allow it only to be released by a sliding motion.

The base plate 22 was designed to reduce the need for attachment hardware and for ease of installation. The view shows the base rails 24 extending beyond the edge of the case 4, this will allow for a threaded bolt (not shown) to be inserted between both extending rails 24, thus preventing the transformer sliding along the rails and becoming separated from the base plate 22. This system 2 with base plate 22 can be installed in a Current Transformer cabinet (not shown). The cabinet would have a mounting bracket (not shown) built-in so that the transformer could be mounted to the back face of the cabinet. The transformer's base plate 22 has standard slots that align with the holes in the mounting bracket (not shown).

Every instrument transformer has a base plate 22 with mounting holes 23 that align with attachment holes on the mounting plate (not shown) located in a transformer cabinet (not shown). The hole size and spacing in both directions are standardized such that the alignment is innate. Therefore the design of the base plate 22 is for the sole purpose of maintaining a strong physical connection between the system 2 the base plate and the mounting plate (not shown) so that the system 2 does not move within the cabinet (not shown).

The ease of installing and removing a base plate 22 from a system 2 is beneficial. The reduction of a number of stages in the manufacturing process to install the base plate 22 is an additional benefit. A base plate 22 also protects the base of the system 2 from wear; therefore the base plate 22 is at least as big as the bottom of the system 2.

In the case of the TIMS the base plate 22 meets the requirements noted above. The TIMS is comprised of 2 or more transformers aligned side by side in one embodiment. The base plate 22 covers the entire base of the TIMS, and the physical dimensions are based on the number of transformers and the spacing between each transformer.

The design of the TIMS base plate 22 is to secure the system 2 to the base plate; therefore the base plate 22 must have a means of stopping the movement of the transformer in relation to the base plate 22 and align the mounting attachment holes 24 for each transformer. At one end of the base plate the steel is bent upwards at 90 degrees to form a tab 33, to stop the forward movement of the transformer as it rides along the rails. The tab has a threaded aperture to support long threaded bolt 79. The threaded bolt 79 can be used to secure the meter 66 as well as be used to secure the cover 80 (not shown). The tab 33 can also be used as a means of carrying the full weight of the TIMS 2. The weight of the TIMS will exceed the combined weight of 3 instrument transformers; therefore a means of managing the weight of the TIMS during installation is important. The tab 33 will also be constructed to accommodate the installation of the TIMS on an electrical distribution pole.

At the opposite end of the base plate 22 where the transformer is inserted to be fastened onto the base plate 22, the rails extend beyond the base plate 22 far enough for a bolt or threaded rod 32 to be inserted through the rails, interconnecting the rails rod apertures 34. The rod 32 can be inserted after the transformer has ridden the full length of the base plate 22 and has come to a stop. The rod 32 would connect the rails 24 through the rod apertures 34, thus locking the system 2 on the base plate 22 and impeding the movement of the system 2 in a direction off the rails 24.

Referring to FIG. 1 the transformer instrumentation and metering system (TIMS) of the invention is illustrated in an embodiment appropriate for use with a standard North American electric utility meter socket (not shown). As illustrated, the case 4 has one or more windows 20 therein for receiving bar inserts 52 also referred to as conductors (bar inserts shown in detail in FIG. 5). In the present embodiment, the case 4 has three window slots 20 longitudinally extending through the side of the case 4 for a three-phase system, each window for receiving a conductor or separately a bar insert 52. Other embodiments include but not limited to:

Single Phase, Transformer Rated, 1.5 element:
3 wire [2 conductors and a neutral], 1.5 element, 4 or 5 jaw meter configuration Equipment: (1) 3 wire current transformer, 4 pole test switch TIMS: 2 window transformer and 2 current shorting switches and 2 voltage switches Polyphase, Transformer Rated, 2 element, Delta connection:
3 wire (3 phases no neutral), 2 element, 8 jaw meter configuration Equipment: (3) 2 wire current transformers, 7 pole test switch TIMS: 3 window transformers and 2 current shorting switches and 3 voltage switches Polyphase, Transformer Rated, 2.5 element, Y connection:
4 wire (3 phases with neutral), 2.5 element, 13 jaw meter configuration Equipment: (3) 2 wire current transformers, 10 pole test switch TIMS: 3 window transformers and 3 current shorting switches and 4 voltage switches Polyphase, Transformer Rated, 3 element, Y connection:
4 wire (3 phases with neutral), 3 element, 13 jaw meter configuration Equipment: (3) 2 wire current transformers, 10 pole test switch TIMS: 3 window transformers and 3 current shorting switches and 4 voltage switches Referring to FIG. 1, on the upper deck 5 of the case, above the windows 20 are pluralities of switches that are shorting devices, switches and testing terminals as well as a meter socket protected by a cover securing the switches and meter. The cover assures that the switches and meter are secured and that tampering would be detected. The cover also assures that the switches are closed; otherwise the cover will not be seated correctly. Many different implementations are possible.

The magnetic cores isolated secondary wiring is connected to current shorting switches 12. As an example of the use of the current shorting switches 12, if the metering installation needs to be rewired or the meter changed, while maintaining service to the customer, the shorting switches 12 may be closed to prevent dangerous voltage buildup. Shorting switches 12 that are inadvertently left closed will cause a loss of revenue to the utility, as the current will be unmetered.

Figure 2:
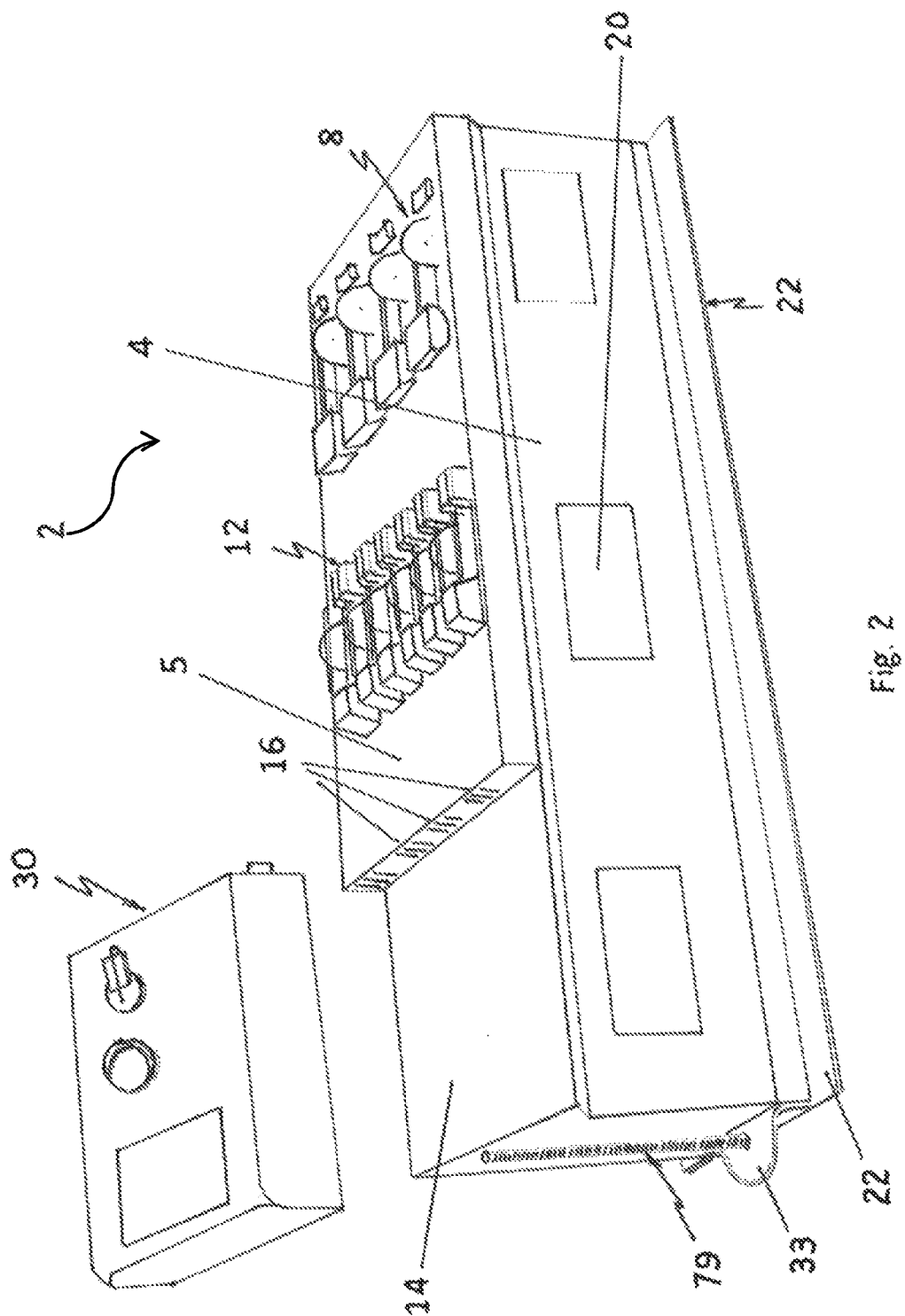
FIG. 2 shows an isometric view of an alternative embodiment of the transformer metering system.

With reference to FIG. 2, a further embodiment of the upper deck 5 of the system 2 with a meter connection for a "bottom connect meter" 30 is shown. The European meter wiring connections are located on the bottom of the meter, thus the name bottom connect meter 30. In this embodiment a European style bottom connect meter (9"×3"×5") is used. The transformer's upper deck is modified to accommodate a bottom connect meter with meter installation lugs 16 corresponding with the location of, and aligned to, the connections of the meter 30. The meter 30 is then plugged in or hardwired in series with the switches. The meter 30 could then be secured and stabilized to the transformer with attachment hardware and cover.

Figure 3:
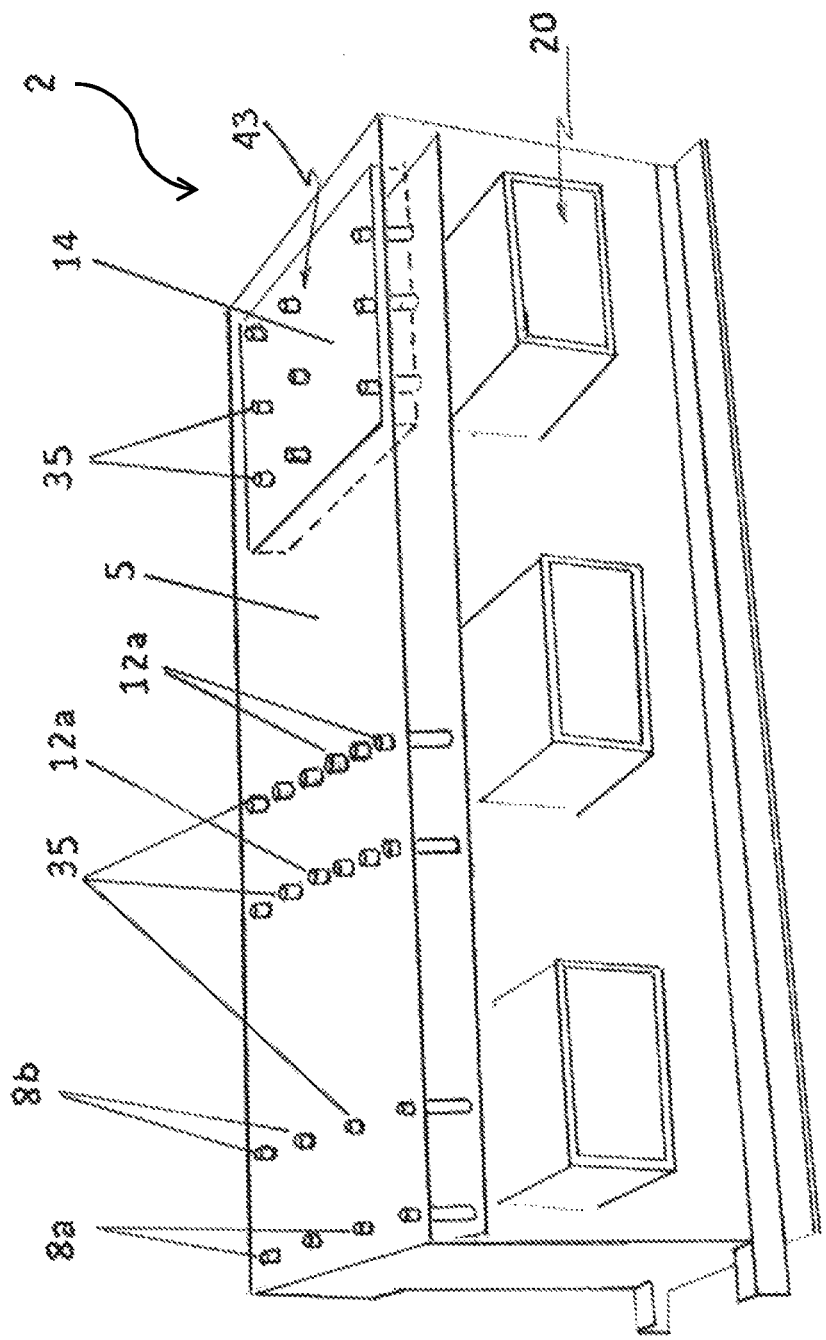
FIG. 3 shows the upper deck of the metering system.
Figure 4:
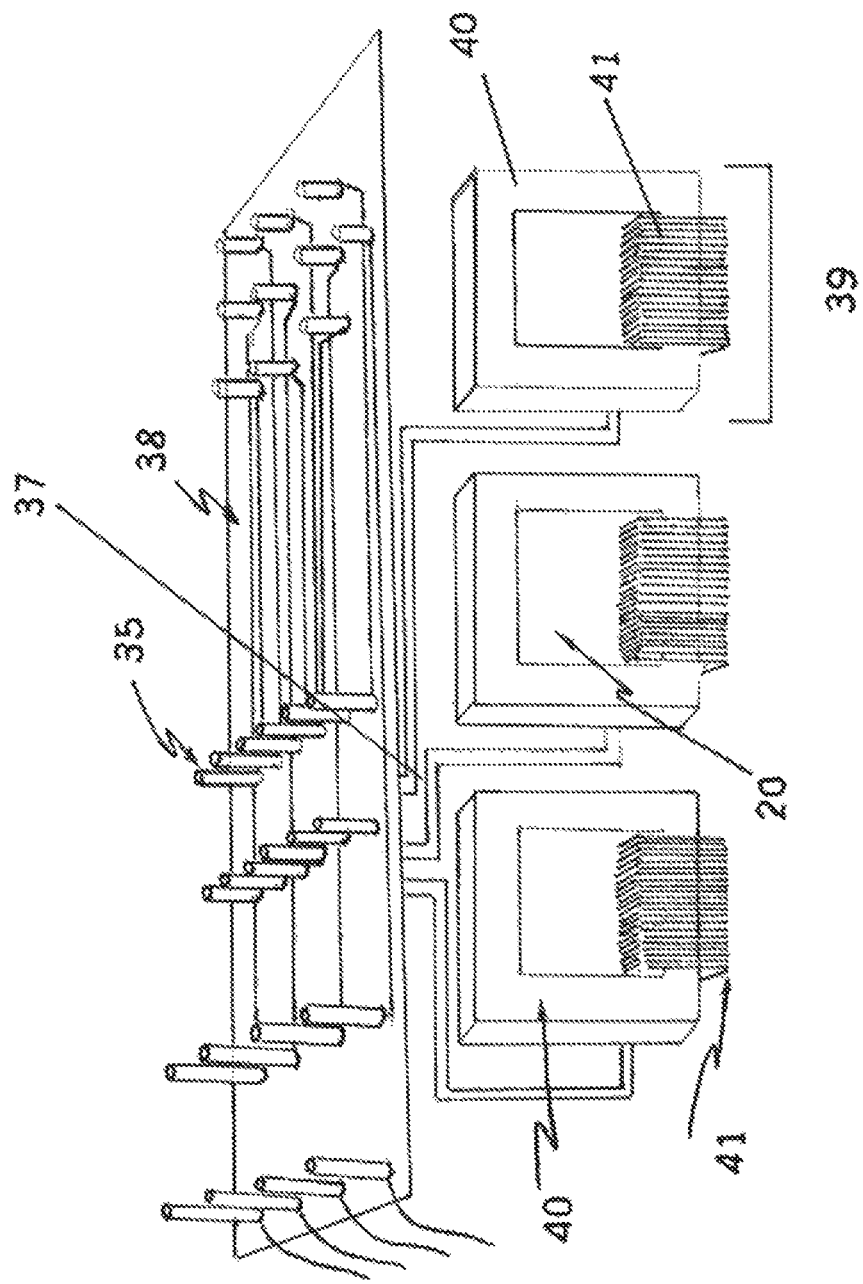
FIG. 4 shows the interior of the metering system.

With reference to FIGS. 3 and 4, the wiring harness 37 and the assembly of the transformer system 2 is shown, and is of assistance in describing a method of assembly of the system 2. The actual Harness (the deck that is inserted into the plastic injection mold with conductive wiring) cannot be conductive. The attachment hardware (where the switch is attached) is conductively attached to the meter socket by conductive wiring only.

The bridge between the upper deck switches 8, 12 and the wiring harness 37 is the attachment hardware 35, which is mounted through the upper deck 5 of the system 2. The attachment hardware 35 acts as a guide for wiring. Once the meter form (U.S., European, socket, bottom connect, for example) has been chosen the upper deck 5 is developed to have connection in appropriate places for the switches 8, 12 and the installation lugs 16. Next, the layout of the wiring harness is determined; this includes the location and the size of all the attachment hardware 35. As an example, FIG. 3 shows one embodiment of the attachment hardware is a set of attachment hardware 35 installed on the wiring harness 37 that act as junctions for the wires and attachment hardware 35 for the switches 8, 12. The secondary leads (not shown) from the secondary windings 41 from each transformer 39 are secured and connected to what will be the line side 12a of the current shorting switches 12. The load side 12b of the shorting switch 12 is connected to the meter by meter wiring 38. All current and voltage connections are wired from the switch hardware bolts to the meter connection bolts 43 along the wiring harness.

The hardware is assembled within the plastic mold (not shown). First the magnetic cores 40 with secondary winding are positioned over and around the windows 20 and slid into position. Next the prewired wiring harness 37 is connected to the secondary windings 41. The harness 37 is positioned above the magnetic cores 40 and below the upper deck 5. Once the harness 37 is in place pressure is exerted on the underside of the harness 37 in the direction of the upper deck 5. The attachment hardware 35 will then penetrate predrilled holes (not shown) on the upper deck 5 exposing enough thread to attach switches.

Each current shorting switch 12 pair for each transformer is located on the upper deck 5. The TIMS 2 is prewired from the magnetic core's secondary wiring 41 to the current shorting switches 12 to the meter socket 16 along a wiring harness 37. Also located on the upper deck 5 are voltage switches 8. The voltage switches 8 can be pre-wired direct from the primary winding or the Bar-Insert or it can be used in conjunction with voltage transformers. Therefore the voltage switch is used in series between the meter and the primary winding or voltage transformers. The line side 8a of the voltage switches 8 is connected to a voltage source, while the load side 8b is connected to the meter. There are a number of different voltage connections that could be employed. The end user could use voltage transformers. Therefore the line side 8a of the voltage switch would be available to attach itself directly to the voltage transformers. The voltage source could be the primary bar of the bar insert 52 or from the conductor directly.

The laminated magnetic cores 40 of the transformers 39 are made of thin, insulated iron sheets. The magnetic cores 40 as illustrated have a rectangular form of various thicknesses and widths that encompass comfortably around the window opening 20. The rectangular design channels the greatest amount of magnetic flux (caused by the primary) in a magnetic circuit which ensures that the secondary is immersed in as great a proportion of the magnetic flux. By utilizing laminated iron sheets the magnetic core is equivalent to many individual magnetic circuits, each one receiving only a small fraction of the magnetic flux (because their section is a fraction of the whole core section). Furthermore resistance in the magnetic core is critical to the operation of the transformer, the constant of proportionality is defined as the resistance R, in the equation $V=IR$. A small addition of silicon to Iron (around 3%) results in a dramatic increase of the resistivity, up to four times higher.

Height is an important factor for the design of the TIMS 2 with a standard socket meter (not shown). The TIMS 2 is intended to be installed in a metal cabinet (not shown), where depth may be at a premium. Magnetic core 40 height can influence the height of the TIMS. One embodiment of the TIMS containing meter is 12 inches high, allowing the TIMS to fit into a 12 inch deep cabinet. Without influencing accuracy or system operation, the objective is to design an even shallower TIMS where it can fit into all meter cabinets (not shown) of various depths. The greatest influence on the design of the magnetic core is the window opening. As illustrated in FIG. 3 the window 20 opening is large enough for (3) 500 MCM cables (but not limited to). Another influence on the height of the magnetic core 40 is the secondary winding 41, using a variable number of turns allowing for variable and dual ratios to be utilized in the same housing. Another influencing factor on the design of the magnetic core 40 is the ability to install the TIMS into a "Cooper CT Mounting Bracket" with 7" centers between transformers.

The magnetic core 40 can take on various designs including, but not limited to, rectangular, circular or oval, with the ultimate goal of placing the primary conductor into the center of the core. The operation of winding the secondary 41 around the magnetic core 40 works best with a rectangular or square design. Copper secondary wire 41 with high temperature insulation is wound on each core by an automated process designed to minimize stress and distortion.

Transformer cores 40 are encapsulated and insulated within the TIMS plastic injection mold. The cores are insulated by a molding process whereby the Thermal Plastic Elastomer (TPE) or any other equivalent insulating material is injected into the plastic case 4 retaining and securing the steel core and secondary winding.

Window type or donut current transformers 39 in general have lower burden capability for a given ratio than bar-types because they have only one primary turn and hence do not magnetize the core so efficiently. Due to all the magnetic cores secondary wiring in the TIMS are inches from the switches and socket, thus the burden is minimal.

While primary current is flowing, the secondary wiring circuit for each current transformer must be a closed circuit. Each current transformer must have a means of shorting the secondary circuit instantaneously, without opening the circuit. The meter is placed in series with the transformer and completes and closes the secondary circuit. When the meter is removed from the circuit (without using the current shorting switch), we open the secondary circuit. When the secondary circuit is left open and the primary current is flowing, voltage builds up in the current transformer. The high voltage build up can cause damage to the current transformer and could effect accuracy or ultimately catch fire. The secondary function of the current shorting switches and voltage switches are to provide a means to test the meter and or system.

All wire and wiring connections are isolated and encapsulated within the transformer 39 by the elastomer insulation An exception to this design is when the voltage connection is made exterior to the TIMS and there is a direct connection to the voltage switches (line side) 8a. The wiring arrangement as specified by numerous metering agencies may be completed according to the requirements of each. The secondary current connections and the voltage connections are connected using wires of the wiring harness 37 from the switches 8, 12 to the meter lugs 16. The meter lug 16 and inset 14 arrangements as shown corresponds with a standard meter socket for a 13 jaw meter. The meter socket position can be rotated from the 12 o'clock position to 3, 6 and 9 o'clock position.

The meter socket 54 may also be replaced by a wiring conduit cover whose purpose is to channel the wire to a remote metering site or the socket is removed all together, thus making the TIMS 2 a transformer(s) only with shorting devices.

Figure 5:
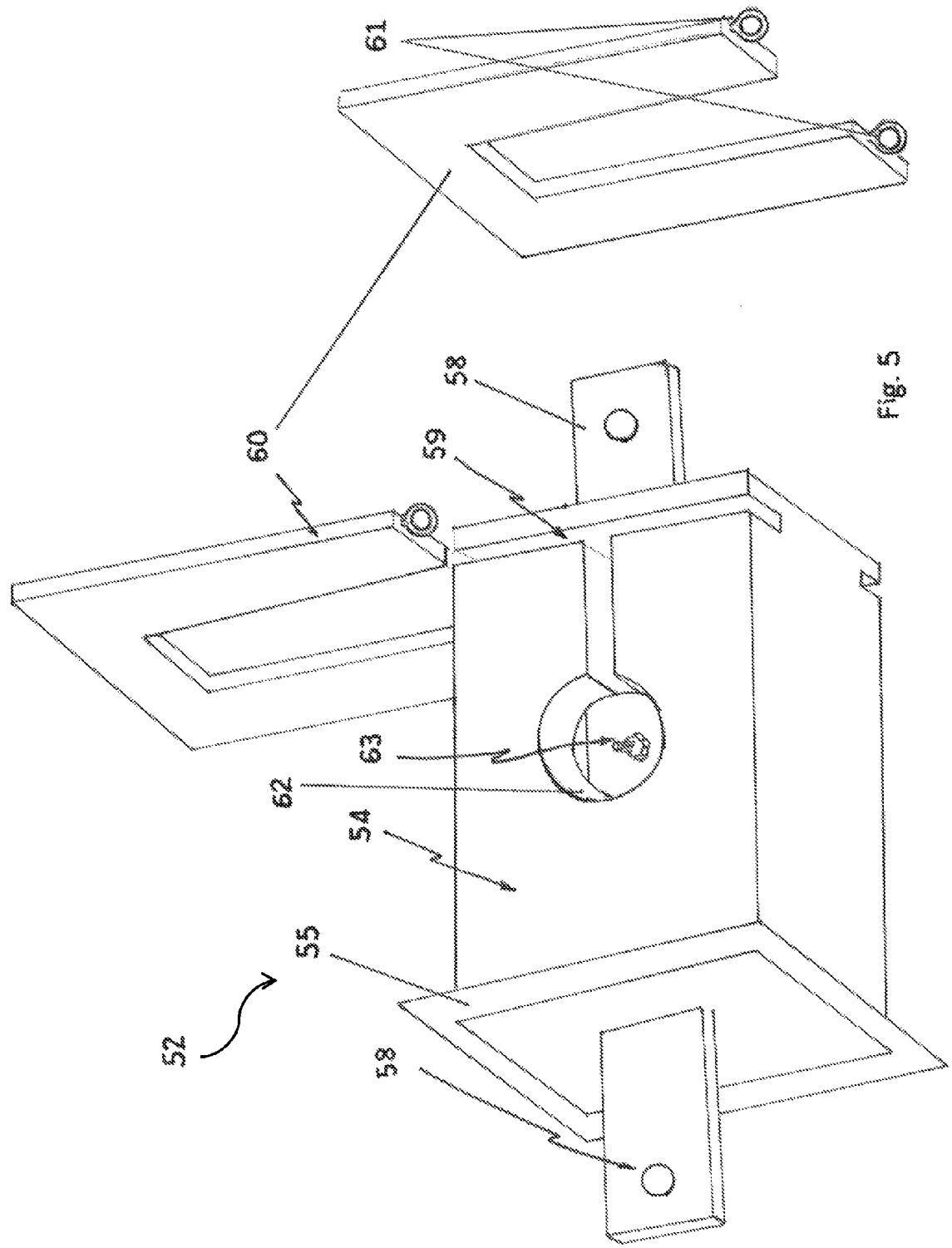
FIG. 5 shows the bar insert of the transformer metering system.

With reference to FIG. 5, the bar insert 52 is shown. The bar insert 52 allows a window type transformer (without a primary winding) to become a bar-type transformer with a single primary winding. The bar insert 52 comprises of a primary conductor passing through an insulated mass that fits into the transformer's window slot. The bar insert 52 is a plastic injected mold that centers and secures the primary bar 63 within the magnetic core 40. The primary bar 63 varies in length, width and thickness based on the amount of amperage passing through. The TIMS is a single plastic injection mold with 2 or more window slots 50, each window slot 50 is encompassed by a steel magnetic core wound with copper secondary wiring (transformer). The window slot 50 provides a passageway through the core through which a primary bar 63 within a bar insert 52 may pass and serve as the primary winding. Therefore the utility has the choice to use either a window-type or bar-type transformer. The bar inserts 52 are designed to fit tightly into the existing window 20. The bar insert 52 has a permanent flange 55 on one end of the insert, when the bar insert 52 is inserted into the window 20, the permanent flange 55 is wider than the window 20 and prevents the bar insert 52 from passing through the window 20 in one direction. To fully stabilize the bar insert 52 while positioned within the window of the transformer a second "C" flange 60 is inserted on the other end of the bar insert in a receiving channel 59. The "C" flange 60 is guided by the receiving channel 59 into the end of the bar insert 52. When the "C" flange is inserted into the back end of the bar-insert, we now have a flange on both ends of the insert preventing the removal of the bar-insert from the window slot. To secure the installation and prevent the removal of the bar-insert without detection, a means of sealing the "C" flange is provided, for example a sealing wire passing through the eyelets 61. The "C" flange 60 may be made of metal or plastic.

A secure bar-insert 52 or primary winding presents a number of options for a primary voltage connection. In this particular case voltage is provided directly from the primary conductor, by a means of tapping off voltage on the line side of the exposed bar by providing a screw on the bar. The wiring must find its way back to the voltage switches.

The TIMS provides a way to conceal the voltage wires or the wires can be exposed so that connection to voltage transformers is made available.

Security is paramount with regard to revenue metering. For example, no external wires may be exposed. This bar insert 52 will prevent any voltage wires being exposed as the current wires are encapsulated within the insulated mass 54. In the case of receiving voltage for each phase and passing it forward to the meter connections, the end user could use voltage transformers, however the wires would be exposed and therefore a secure cabinet (not shown) is required. The end user may choose to secure all voltage wires with the use of the bar insert 52. At the end of cubic mass containing the primary conductor where the "C" flange is inserted, the primary bar conductor 63 is partially exposed by removal of the insulated mass 54. A wire from the line side of the voltage switches attached to the wiring harness penetrates the wall of the plastic mold, through the slot 62. The voltage wire is later attached to the primary conductor 63 of the bar insert 52. The voltage wire attached to each primary bar 63 can be secured by inserting the bar insert 52 into the slot 62 allowing the voltage wire slack to be inserted past the "C" flange 60 position. By inserting the "C" flange 60, covering and securing the voltage wire is accomplished.

A standard height of 2 . . . 5" (bar to base) for the bar insert 52 allows the TIMS to be installed in a Cooper™ CT Mounting Bracket. The primary bars 63 are attached to each set of current lugs that are spaced 7" apart. The design of the TIMS and the spacing between each transformer is set to accommodate the Cooper™ bracket. However, the spacing will be flexible; various sizes will be developed for other Bus-Bar arrangements. Movable extensions (not shown) for primary bars 63 will provide an alternative way of connecting the primary conductor to other bus-bar arrangements.

Figure 6:
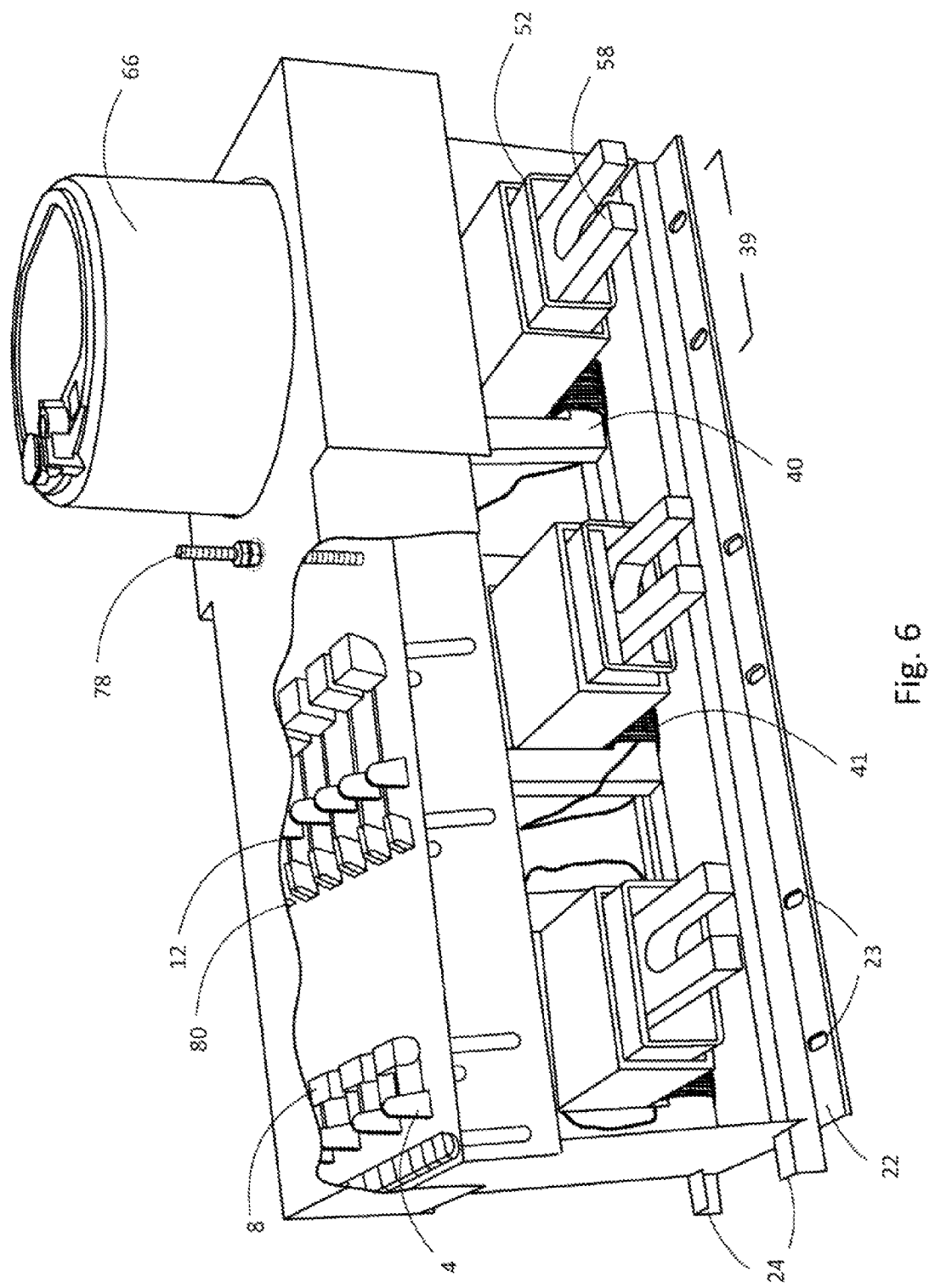
FIG. 6 shows an isometric view of the transformer metering system with the cover cut away.

With reference to FIG. 6, the meter cover 80 is the primary security feature. The cover 80 is intended to enclose and secure the switches 8, 12 as well as encompass the meter 66. The grasping device and ring together with the cover completely secure and stabilize the meter. The cover arrangement as shown in FIG. 6 shows a cover bolt 78 penetrating through the cover 80. The cover bolt 78 will be used as a means of securing the TIMS. The cover bolt 78 penetrates the upper deck 5 of the TIMS 2 and when the TIMS' cover 80 is installed the cover bolt 78 penetrates the cover. The cover 80 provides security to the switches 8, 12 such that the switches 8, 12 cannot be opened when the cover 80 is installed. The cover 80 is also a means of securing the meter 66, such that the meter 66 cannot be removed when the cover 80 is installed. Therefore a means of securing the cover 80 and preventing the cover 80 from being removed is essential. As shown in FIG. 9, a bolt aperture 83 through the cover bolt 78 at the point just above the cover 80, when the cover 80 is fitted, is provided. A seal 81, 82 is installed by penetrating the aperture 83 on the cover bolt 78 with a wire loop 81 closed with a tamper-proof plastic tab 82 Therefore the only way to remove the cover is to remove the seal located on the long bolt.

Starting at and penetrating through the wiring conduit/divider, and further through the upper deck 6 and later through the cover is cover bolt 78. Typically a seal would be used on this cover bolt 78 that would prevent the cover 80 to be removed unless the seal was also removed. In other arrangements several bolts may be used, or other fasteners known in the art.

Figure 7:
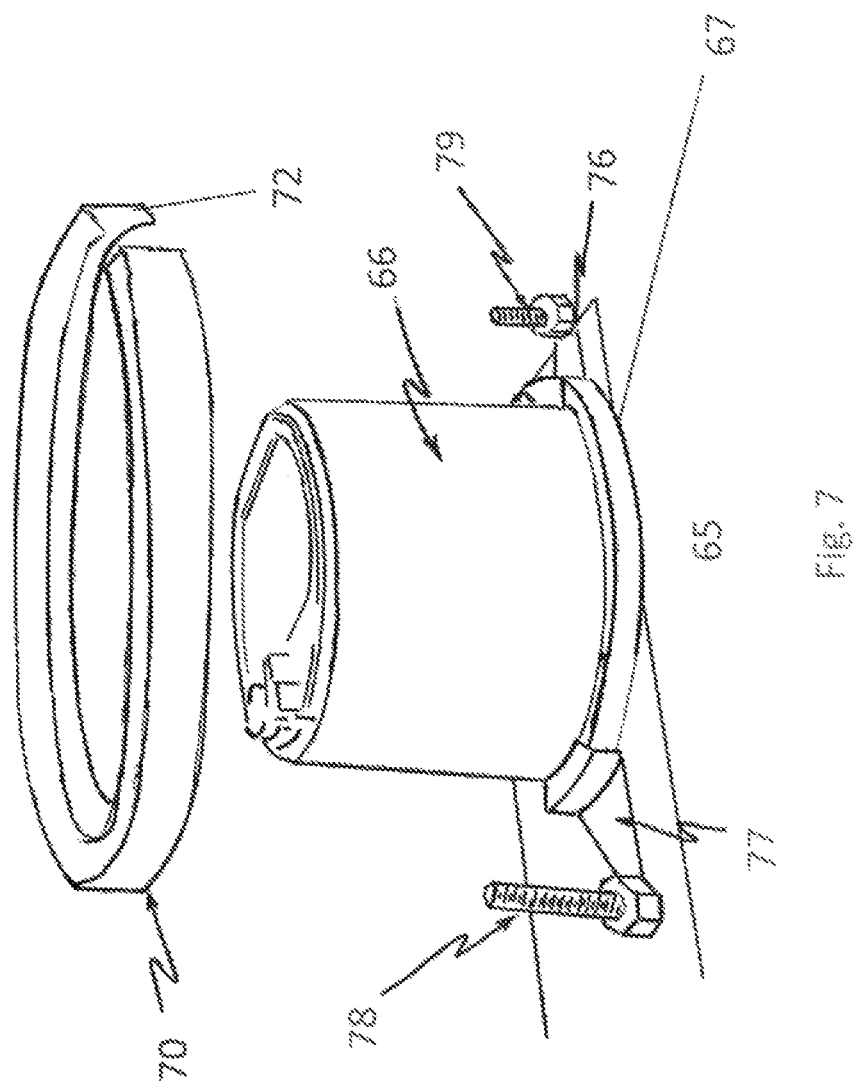
FIG. 7 shows a detail view of the meter installation on the metering system.

With reference to FIG. 7, means for securing a meter 66 on the metering system 2 are shown. When using any revenue meter 66, utilities require to secure and stabilizing the meter 66. Typically a socket meter 66 is meant to be seen and read periodically and is therefore installed on the outside of a meter cabinet that contains a socket adapter for the meter to plug into. The design of the hardware is used for the purpose of stabilizing the meter and prevents the meter from moving out of position. In the prior art, a meter is secured to a cabinet face by means of a meter ring which prevents the meter from being separated from the cabinet collar. In the design of the TIMS there is no collar; therefore the design of the hardware was for the purpose to replace the collar. In one embodiment, there are two reinforcing plates 76, 77 held in position by bolts 79, 78, wherein the plates 76, 77 are gripping the base of the meter on two sides. This alone will not prevent the meter from moving, therefore a meter ring is required to grip the reinforcing plates and meter together, and when we tighten the meter ring we prevent the meter from moving. The meter itself can be secured by sealing the meter ring.

There are 2 long threaded bolts 78, 79 that are positioned on either side of the meter. The cover bolt 78 is located approximately at the center of the upper deck 5, and may be used as a means of carrying the transformer and securing the cover, while the second bolt 79 is attached to the end of the base plate 22. On each threaded bolt 78, 79 is a reinforcing plate 76, 77 that can be positioned by threading it up or down on the threaded bolt. Once the reinforcing plates 76, 77 have grabbed an edge of the meter, a meter ring 70 is installed grasping the meter and the grasping devices together preventing them from separating and preventing the meter 63 from becoming unattached with the connections on the upper deck 5.

With reference to FIGS. 6, 7 and 8, the cover bolt 78 is similar to long bolt 79 with regard to securing the meter 66 but is used as a means of bolting down the cover. The device used to secure the meter is attached to the bolt 79. The device is positioned with the collar 68 of the meter 66 and braces the meter 66. Next a meter ring 70 is positioned and installed seizing the device and the meter while still being attached to the bolt. The cover bolt 78 may also be used as a handle for carrying the TIMS.

A cover 80 fits over the front of the case 4 to seal in the utility meter 66 and cover the voltage switches 8 and current shorting switches 12, and protect them from tampering and from the environment. The main purpose of the cover 80 is to secure and protect the switching, shorting and testing system located on the front of the TIMS 2. The secondary purpose is to secure the instrumentation or meter or meter socket from tampering. The cover arrangement as shown in FIG. 6 is made specifically for a utility meter 66. Once the switches 8, 12 are closed and the cover 80 has been installed, the cover 80 will restrict the movement of switches 8, 12 and will not permit them to open. Once the meter 66 has been installed and the cover 80 has been installed, the cover will assist in securing the meter. If a switch is left open and the cover is installed, it will be noticeable that the cover 80 is higher and rocks side to side indicating an open switch(s).

In reference to securing the cover 80, what the industry needs is a means of determining or indicating that the cover has been compromised without damaging the instrument. There are a number of different scenarios that could be utilized to secure the TIMS 2 in order to show whether it has been compromised. Removal of the meter, tampering with the switches will not be possible unless the cover 80 is damaged. From a security perspective utilities seal everything when it comes to equipment used in the revenue stream. Utilities are concerned with theft of power and can use up to 10 seals to secure the revenue site, the TIMS will only require 1 seal, on the cover bolt 78.

With reference to FIG. 9, starting at and penetrating through the wiring conduit/divider, and further through the upper deck 6 and later through the cover is cover bolt 78. Typically a seal made of wire loop 81 closed with a tamper-proof plastic tab 82 would be used on the cover bolt 78, passing through a bolt aperture 83, that would prevent the cover 80 to be removed unless the seal was also removed. In other arrangements several bolts may be used, or other fasteners known in the art.

Insulation may comprise TPE thermoplastic elastomer insulation has high dielectric and mechanical strength, exhibiting excellent resistance to ultraviolet deterioration Secondary terminal arrangement wiring may include compression connectors.

The invention claimed is:

1. A current transformer system comprising:
   a. a securable case;
   b. two or more current transformers each having a core and secondary windings connected to a secondary current circuit, the transformers mounted within the case;
   c. a wiring harness within the case connecting the secondary windings of the two or more transformers having shorting current switches on the case, the shorting current switches connected to the wiring harness for short circuiting the secondary current circuit; and
   d. voltage switches on the case and connected to the wiring harness for disconnecting a voltage.

2. The system of claim 1 wherein the current transformers are window type transformers having a transformer window.

3. The system of claim 2 further comprising bar inserts for placement within each transformer window, each bar insert providing a primary winding for each transformer.

4. The system of claim 1 wherein the current transformers are bar-type transformers.

5. The system of claim 1 further comprising an instrument mount for a meter connected to the secondary current circuit, wherein the current switches are connected to the instrument mount.

6. The system of claim 1 wherein the transformers are dual ratio transformers.

7. The system of claim 1 further comprising a base plate for mounting the system to a stationary object, comprising:
   a. a rectangular plate having first and second ends, having at least one rod aperture at a first end and a plurality of mounting holes for affixing to a stationary object;
   b. at least one rod for engaging with the at least one rod aperture for locking the system on the base plate; and
   c. two rails running in parallel on the rectangular plate for engaging with corresponding grooves in a case of the system.

8. The system of claim 1 further comprising a securable cover for protecting the switches and meter, the cover securable by at least one seal.

9. The system of claim 8 further comprising a cover bolt to fasten the cover to the system, the cover bolt secured by a seal.

10. The system of claim 1 wherein the case is made of a material selected from the group consisting of metal, plastic and composite material.

\* \* \* \* \*